United States Patent [19]
Söderquist

[11] Patent Number: 5,982,238
[45] Date of Patent: Nov. 9, 1999

[54] CLOCK SIGNAL DISTRIBUTION AND SYNCHRONIZATION IN A DIGITAL SYSTEM

[75] Inventor: Ingemar Söderquist, Linköping, Sweden

[73] Assignee: Saab Dynamics Aktiebolag, Linköping, Sweden

[21] Appl. No.: 09/011,026

[22] PCT Filed: Aug. 8, 1996

[86] PCT No.: PCT/SE96/01010

§ 371 Date: Feb. 6, 1998

§ 102(e) Date: Feb. 6, 1998

[87] PCT Pub. No.: WO97/06478

PCT Pub. Date: Feb. 20, 1997

[30] Foreign Application Priority Data

Aug. 8, 1995 [SE] Sweden .................................. 9502780

[51] Int. Cl.$^6$ .............................. H03L 7/07; H03L 7/081; H03K 5/15
[52] U.S. Cl. .................................. 331/2; 331/18; 331/74; 327/149; 327/295
[58] Field of Search .................................. 331/1 A, 2, 18, 331/25, 55, 74, 172; 327/147–150, 291, 295, 297

[56] References Cited

U.S. PATENT DOCUMENTS

| | | | |
|---|---|---|---|
| 4,847,516 | 7/1989 | Fujita et al. ............................. | 331/2 X |
| 4,868,522 | 9/1989 | Popat et al. ................................. | 331/2 |
| 5,008,636 | 4/1991 | Markinson et al. ......................... | 331/2 |
| 5,122,679 | 6/1992 | Ishii et al. ............................... | 307/269 |
| 5,204,555 | 4/1993 | Graham et al. .......................... | 307/465 |
| 5,448,193 | 9/1995 | Baumert et al. ......................... | 327/156 |
| 5,481,573 | 1/1996 | Jacobowitz et al. ..................... | 375/356 |
| 5,539,344 | 7/1996 | Hatakenaka . | |
| 5,565,816 | 10/1996 | Coteus ....................................... | 331/2 |
| 5,764,092 | 6/1998 | Wada et al. .............................. | 327/271 |

OTHER PUBLICATIONS

G. Koetzle. "Computer Clock Distribution System with Programmable Delay and Automatic Adjustment." *IBM Technical Disclosure Bulletin* vol. 18, No. 6, Nov. 1975, p. 1912.

*Primary Examiner*—David Mis
*Attorney, Agent, or Firm*—Pollock, Vande Sande & Amernick

[57] ABSTRACT

A method for increasing a working speed in a synchronous digital system, which includes a plurality of separate system parts, and for permitting communication between at least two of the system parts. A common reference signal having a reference frequency is distributed to all system parts. An internal signal clock oscillator of each system part is phase locked to the reference signal. Data is communicated between the at least two system parts by relating the reference signal with the internal clock signal of each of the two system parts by adjusting a phase position of the internal clock signal of a second of the two system parts dependent upon a time delay of the data communicated from the first system part to the second system part so that the phase positions of the internal clock signals correspond.

24 Claims, 3 Drawing Sheets

CLOCK SIGNAL DISTRIBUTION AND SYNCHRONIZATION IN A DIGITAL SYSTEM

FIELD OF THE INVENTION

The present invention concerns a process of the type which is mentioned in the preamble of claim 1, and a device for carrying out the process.

BACKGROUND OF THE INVENTION

Large synchronous electrical systems, such as e.g. computers, are traditionally constructed so that each desired function is successively broken down into smaller and smaller partial functions or operations. In the end there is a collection of operations which each can be executed within one clock period. The transmission of the results to a subsequent operation should timewise be included in the same clock period. Alternatively, the transmission can take place in the subsequent clock period. However, in this case the performance of the system is reduced. In order to insure that all the parts of the system work synchronously, a common reference signal or clock is distributed for the whole system. This traditional construction means that an upper limiting frequency for the system is obtained which is inversely proportional to the area of the system.

Currently, the ambition is to have faster and faster systems with higher and higher clock frequencies, preferably in the order of several GHz in order to be able to increase the performance of the system. The clocks in this case can work within a certain propagation area where the propagation time for the clock signal is relatively short in relation to the cycle time.

It is easy to estimate the limiting frequency for a digital system with a physical size of 30 cm×30 cm. An example of such a system is a portable Personal Computer (PC). However, the present invention is not to be limited to computers but applies to any digital system whatsoever. With the assumption that the system is built upon a circuit board with a dielectric constant $\in=5$, the propagation speed $v=c/\sqrt{\in}$, where c=the speed of light in a vacuum. The transport time from one circuit block in one corner to a circuit block in a diametrically opposite corner can in this case be $T_d=2L/v$, where L is the length of the sides of the system, if the conductors run along the sides. In this case $T_d$ will be approximately 4.5 ns. It is assumed that for every block the input signal is stable before the beginning of the current clock period, and that the operation is performed and transported to the subsequent block within the clock period. Just taking account of the propagation speed of the signal means that the clock period is limited down to about 9 ns. This gives a maximal theoretical clock frequency of approximately 100 MHz for the system. The time for the performance of the operations, the limited drive capacity of the components, RC-delays etc often reduce the maximal clock frequency to 10–40 MHz.

The constituent components can often work at considerably higher frequencies, in the order of several GHz. It is obvious that the traditional way of construction and traditional assumptions result in the performance for the system which, by a long way, does not correspond to the performance of the constituent components.

This problem has been noticed earlier and a solution is suggested in German Patent document DE-A1-44 12 419. This document shows a system which can be divided into partial circuits. In each partial circuit there is at least one signal buffer. The partial circuit receives a reference clock signal as an input signal. The partial circuit also has a sequential connection that is driven as a reaction to a clock signal which is synchronized with the reference clock signal. An output signal from the sequential connections is fed back to the input. With a phase-locked connection, the timing signal is synchronized with the reference clock signal to the sequential connection through the clock signal being phase-controlled. This means that it is the reference clock signal source which directly gives the clock signal for the partial circuit and that it is the incoming clock signal which is phase-shifted.

A circuit, e.g. comprising internal registers, which is equipped with its own clock signal generator with a phase-locked loop is shown in U.S. Pat. No. 5,204,555. The clock signal generator is not phase-adjustable. It receives a reference clock signal from the surroundings and converts the reference clock signal frequency to a higher or lower frequency. The object of this arrangement is to be able to make, for example, internal registers work faster than the surrounding circuits. No phase-shifting is necessary in such a connection.

SUMMARY OF THE INVENTION

An object of the intention is to produce a process and/or device where the performance of a digital system approaches the performance of the constituent components of the system.

Another object of the invention is to produce a process and/or device which makes it possible to work with higher clock frequencies even in large size digital systems.

The above mentioned objects are achieved with a method mentioned in the main claim. Further characteristics and further developments of and a device for performing the method according to the present invention.

Consequently, the invention is based upon distribution of a reference signal, e.g. a clock signal which is the same for the whole system, to all parts of the system as a common frequency reference. However, there does not exist a common phase position for the reference signal. This means that within the system there are no restrictions concerning the transport time for the reference signal to the different parts of the system. The reference frequency is, however, itself phase-stable. The reference frequency does not have to be the same as the clock frequencies of the parts and does not, therefore, need to be high frequency. However, it can, for many reasons, such as power requirements, sensitivity to disturbances etc. be appropriate to let the reference frequency be a low frequency clock. It is however, preferable that the clock frequencies of the parts are whole number multiples of the frequency of the reference signal.

Each part of the system, which can be a circuit board a chip or alternatively a part of a chip, is equipped with a Phase Locked Loop (PLL). The phase position of each part of the system is individually adjustable so that a secure point-to-point-communication is achieved with the part of the system with which it is communicating at the moment. For the sake of simplicity the systems parts are called blocks below. The number of point-to-point-connections for which the phase positions should be adjustable depends on the block structure for the system in question.

Consequently, the constituent parts of the system often work with a phase shift of a whole number of periods in relation to one another but have the same relative phase position when they communicate with each other. It should be noted that even if the description is firstly directed towards a digital system, even analog systems are included in the invention. The system can also work equally well with a hybrid system that includes both analog parts, e.g. comprising digital signal processing of analog sensor signals.

A system construction formed in accordance with the invention differs from traditional system constructions where all the blocks are constructed in order to be able to be connected with each other, irrespective of whether or not a connection is required. In the construction of systems where the method according to the invention present is used, the communication channels and the cooperation between different blocks is something which the constructor must consider in order to optimize the performance of the system.

The method according to the invention permits synchronization of very large digital systems where each part of the system can work with very high clock frequencies. The reference signal can, however, have a considerably lower frequency which is preferable. The system as such can, however, work synchronously at a clock frequency of the order of several GHz, e.g. 1–5 GHz. The methods which are traditionally used today limit the clock frequency of the system to about 10–40 MHz. Consequently, a system constructed using the principles of the invention can work 20–100 times faster, for example, by using the same basic technology as in the manufacturing of digital chips. The method according to the invention is not technology-dependent but can be used with the traditional system construction of circuit boards which use integrated circuits of different types and manufactured according to all technologies, such as CMOS, ECL, etc.

The invention has many fields of application, preferably calculation-intensive applications, such as computers, image processing, radar signal processing etc. Other fields of application are where large quantities of data have to be sorted, such as in telephone exchanges, telecommunications, etc.

BRIEF DESCRIPTION OF THE FIGURES

The invention is described more closely below with reference to the appended drawings, where.

DETAILED DESCRIPTION OF THE INVENTION

Figure 1A:
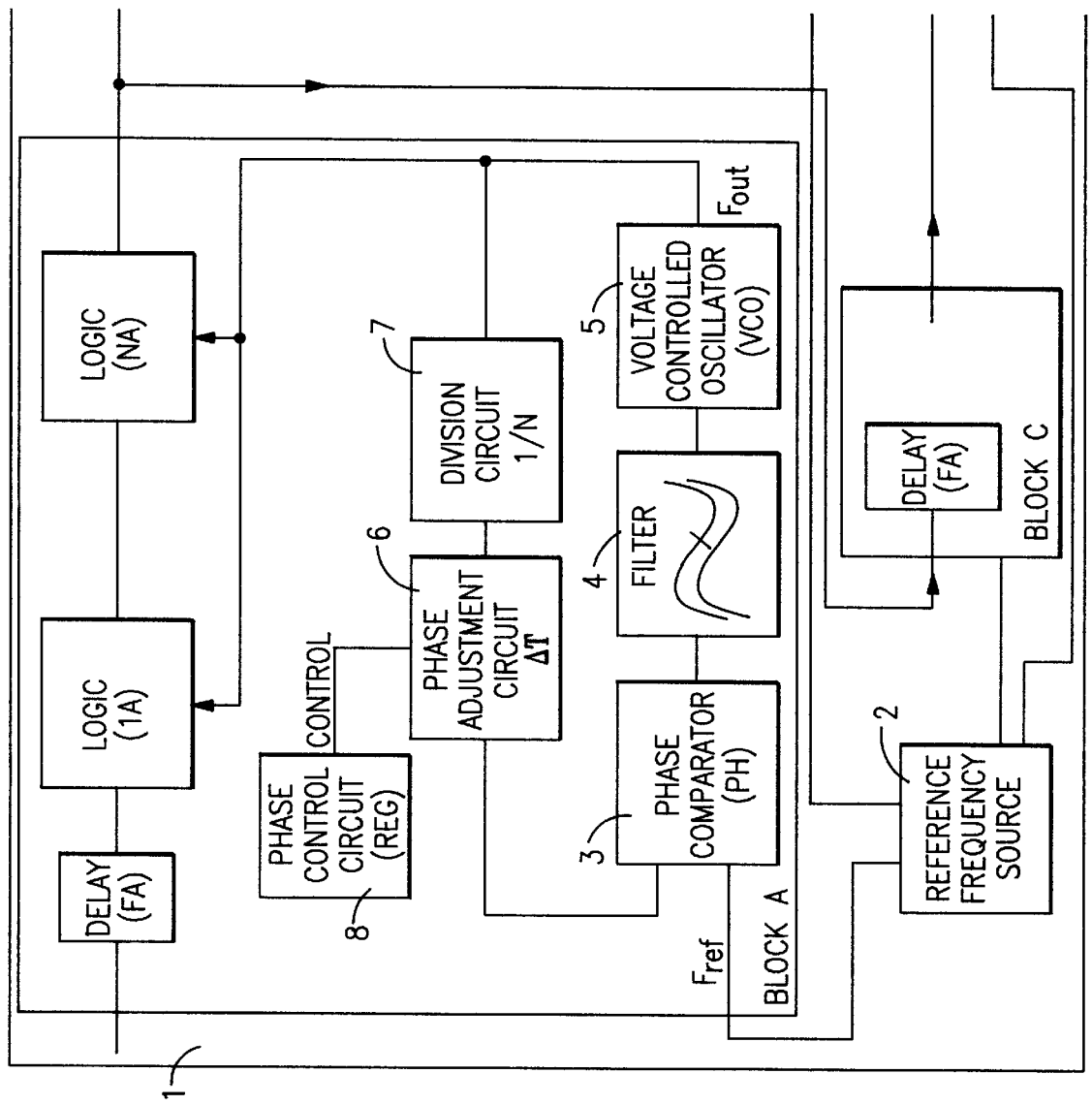
FIG. 1 illustrates some selected parts in a system, which is equipped with an embodiment of the device according to the invention.
Figure 1B:
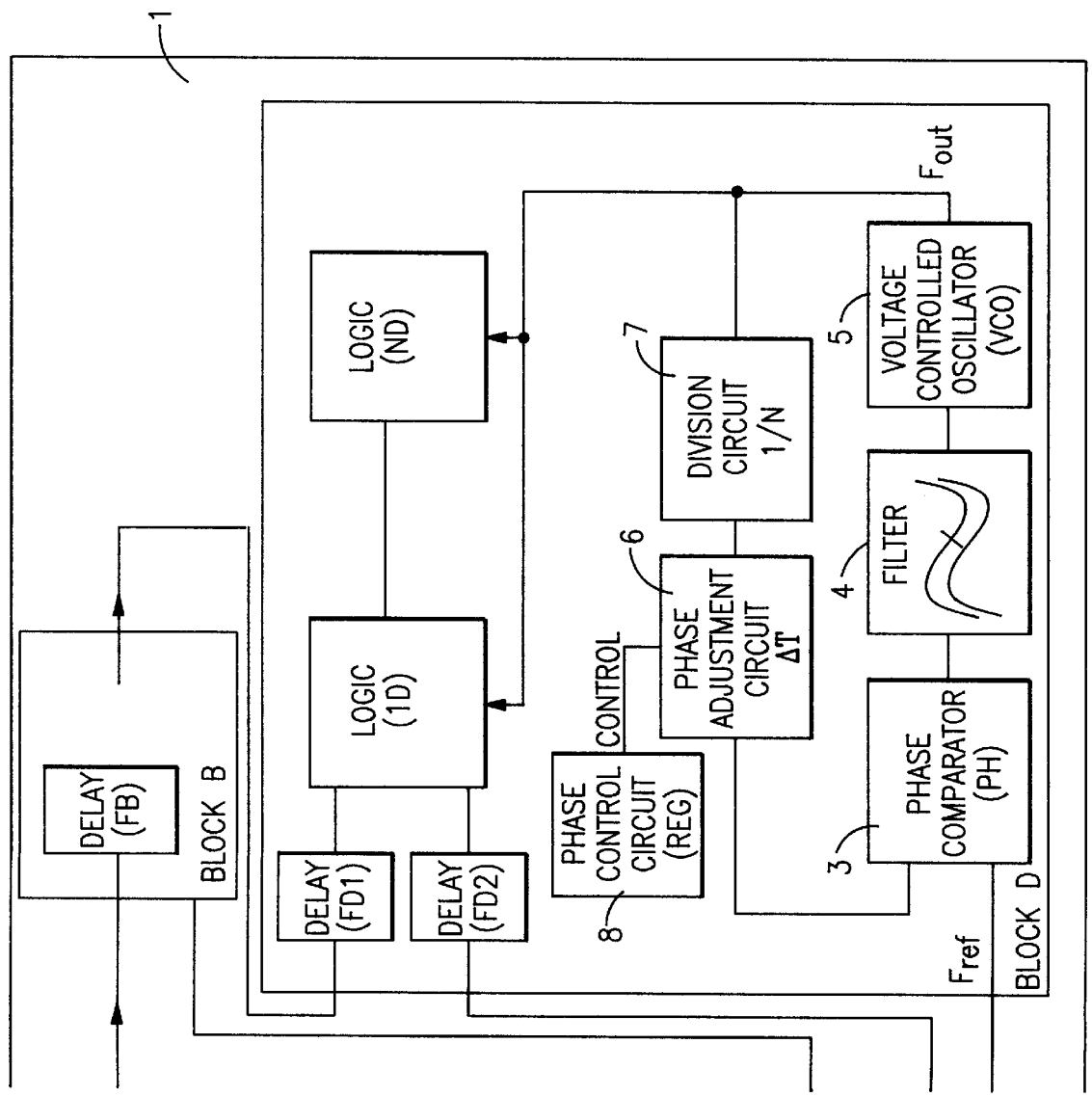

As is evident from FIG. 1, a digital system 1 comprises a number of blocks A–D which each are intended to work at a high frequency, for example in the GHz region.

For the sake of clarity only a few such circuits are shown. The system can also include circuits with different performances concerning high frequency, which can cooperate with the other circuits while using the principles of the invention. For example, external communications can take place With different performances. The system is equipped with a reference frequency source 2 connected among others to blocks A and D, which are intended to have signal communications with each other. These are each equipped with their own internal clock signal oscillator 5, which are individually phase-adjusted for the different system parts in relation to the signal from the reference frequency source 2 so that the communication between the communicating system parts takes place with the same internal phase relationship but can take place within different periods.

The reference frequency source 2 can, in turn, be controlled by an external signal received from another system not shown in FIG. 1.

The communication from block A to block D can take place via two transmission channels, where one is via block B and the other via block C. The reference frequency source 2 is also connected to blocks B and C.

Block A can comprise a number of logic blocks 1A–NA, e.g. in the form of a chip or part of a chip. The internal communication in block A takes place with a high clock frequency, e.g. several GHz, which it is desired that the system shall work at.

In the same way, block D can comprise a number of logic blocks 1D–ND, which can have an internal communication with preferably the same high clock frequency. It is also conceivable to have different clock frequencies in the different blocks, but in this case these blocks must have the ability to change frequencies at the input and/or the output, so that the transmission communications have a transmission frequency which is adapted so that the receiving block can process the transmitted signals.

The reference frequency source 2 has preferably a considerably lower block frequency, e.g. approximately 10 MHz, than the higher clock frequency for the circuit blocks. In this way, the system becomes relatively interference-insensitive. The power consumption of the system is lower if the source 2 has a lower frequency.

According to the present invention, each of blocks A to D includes a phase-locked loop. The embodiment shown in FIG. 1 includes a phase comparator 3 which has an input coupled to the reference frequency source 2. The phase-shifted feedbacked, divided, internal clock frequency is connected to the second input on the circuit 3.

The output signal from the phase comparator is inputted via a filter 4 to a clock signal oscillator 5, which is controlled to give a completely stable high clock frequency. The filter 4 is a slow bandpass filter and filters around the loop frequency in the loop. Such a control is well known in the art and is therefore not described in more detail. Preferably a voltage-controlled clock signal oscillator 5, hereinafter referred to as a Voltage Controlled Oscillator (VCO).

The clock signal oscillator 5 shall give the high working frequency which is phase-locked to the reference source. Each separate VCO in each block consequently will form a high frequency with a certain phase position (time position) $\Delta T$, which is individual for the block. This $\Delta T$ can according to the invention be adaptively individually servo-regulated. The output on the VCO is therefore connected to a division circuit 7 (frequency divider) in order to phase-lock to a frequency which is N times the reference frequency. The output from the circuit 7 is connected to a controllable phase-adjustment circuit 6 which changes the phase position of the high working frequency (from the VCO) relative to the phase position of the reference frequency which reaches the partial block. The output of the circuit 6 is connected to the regulating input of the phase comparator 3. Circuits 6 and 7 can change places with each other. In such a case, $\Delta T$ is dependent on the wavelength of the VCO instead of the reference frequency source 2.

Figure 2:
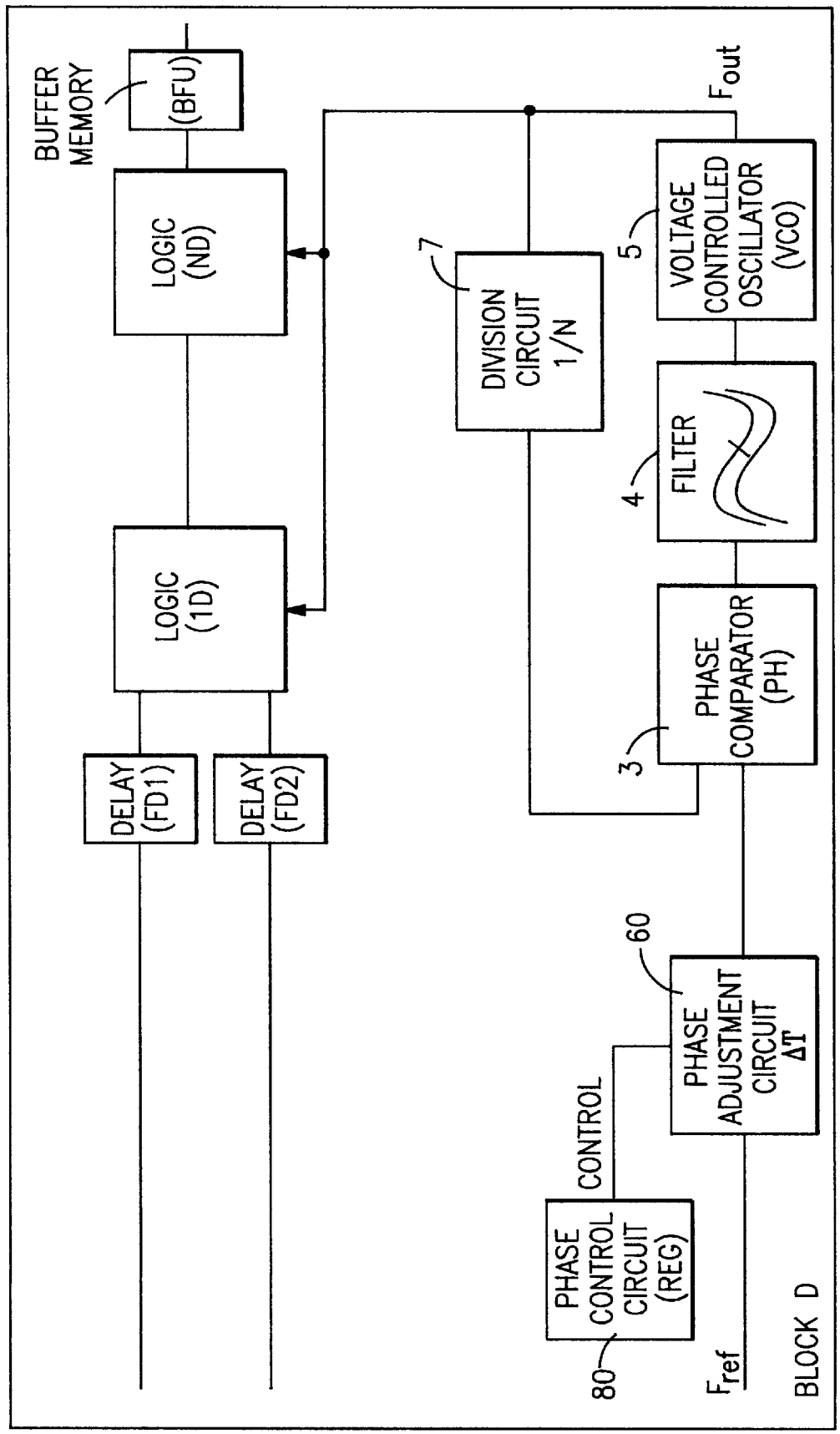
FIG. 2 shows an alternative embodiment illustrating one of the blocks in FIG. 1.

Alternatively, circuits 6 and 8 can be moved from the regulation loop and connected to the input of the phase comparator 3 which is connected to the reference frequency source 2, as is shown in FIG. 2. FIG. 2 illustrates a partial view of an alternative embodiment of block D. The circuits 60 and 80, having the corresponding functions of circuits 6 and 8, are connected between the reference frequency source 2 and the lower input on the phase comparator 3.

The phase adjustment circuit 6 (or 60) is controlled by a phase control circuit 8 (or 80). Phase control circuit 8 or 80 comprises a register, where the manufacturer of the system can individually, e.g. with the help of a computer when the system is completed adjust the phase position for all the blocks. As a result, the phases mutually correspond between the different units which are to communicate with each other. Consequently, it is that which is written in the individual registers 8 (or 80), which in practice determines the phase position in each block The phase adjustments for the different blocks can be compared to the burning-in of a fixed memory. Alternatively, the adjustment can take place adaptively while the system is in use. It should be noted that the function "register" is not necessarily a physical or digital register but can for example be an algorithm in e.g. a processor or a processing circuit of another, e.g. analog, type.

It should be noted that the frequency Fref from the reference source 2 to the different blocks is mutually phase-shifted between the blocks. On the other hand, the phase-regulating circuit 3–8 in the block is phase-locked to a certain part of the reference frequency, for example a flank if the reference frequency is a square signal, or to a zero-transition or the like.

It should be noted that there can be a difference of several clock signal periods between the blocks but that they shall work at the same phase position. The register in the phase control circuit 8 (or 80) adaptively regulates the time delay of the phase adjustment circuit 6 (or 60) so that its phase position is always held at ΔT. In this way the high clock signals from VCO 5 will lie in the correct phase position for the block in relation to the phase of the incoming signal.

Blocks consisting of individual chips can naturally during development be equipped with the phase-locked loop directly, but the phase-locked loop can naturally also be a connected unit, for example in the form of a separate chip connectable to another chip.

During the initiation of the systems all the delays in the phase-locked loops are adjusted to obtain a secure point-to-point communication. It should be noted that it is irrelevant how many clock periods it takes for the data to be transported from block A via block B to block D or via block C to block D. The connections between the blocks can be formed from transmission lines for which the transport time can be more than one or more clock periods. Each delay is adjusted in the phase-locked loop so that the total delay is a whole number and secure communication is obtained.

As is illustrated in FIG. 1, the system can contain parallel transmission channels, which means certain complications. Assume that both transmission channels shown in FIG. 1 are to be used simultaneously to transfer associated partial results processed in blocks B and C to the two communication inputs on block D. Blocks B and C delay the transmitted sighs in different ways in the delaying means which is schematically illustrated as FB and FC; block B can for example be a processor and block C a writable memory (RAM). The delaying of the incoming signals must be adapted to this so that the time differences between the time points for the data from blocks B and C to block D are calibrated away.

Each block, or alternatively some selected blocks can, for this purpose, have a controllable delay circuit FA, FB, FC, FD1, FD2 on its/their communication inputs. Each delay circuit can, just like register 8 (or 80) be adjusted to the right delay in the system by the constructor of the system with the help of an adjustment algorithm which can be implemented in a computer. This adjusts the incoming data for the block in question, which can come in from several different directions, so that they get the same phase position and the same clock frequency position (correct number of whole clock periods) in case this is important. In the case of several steps and/or parallel communication channels, a linear combination of delays can, for example, be introduced which ensure synchronous data transfer.

As mentioned above it is also possible to have blocks which work with different mutual frequencies. In such a case, a buffer memory can be connected to the block with the different working frequency. The above mentioned delay circuits FA, FB, etc can be formed from this buffer circuit. The incoming signal is stored in the buffer memory with the incoming frequency and is read out of the memory with the block's own frequency. This buffer memory in this case functions as a delay unit. In this case, the reading out takes place with the phase position which is installed for the block. Such a block in this case can also have the same type of buffer memory at its output, which in FIG. 2 is illustrated by the circuit BFU, where the output data are written in with the working frequency of the block and are read at the working frequency of the blocks with which this block communicates.

However, normally, most of the blocks in a system work with the same high working frequency. In this case, buffer memories of this type are only placed on blocks with a differing frequency. If the system has many blocks each having their own individual working frequency, it can be practical to equip most of the blocks with the above mentioned type of buffer memory, and in this case appropriately at their inputs.

The phase regulating circuits 3–8 in each block A–D can be a separately connected part of the block, possibly in the form of a connectable chip, or be connected to a circuit or to the individual circuits on a chip during the manufacturing of the chip. The relationship with the individually adjustable delay circuits is the same. It should be noted that an adjustment of the different phase-regulating circuits and delay circuits can be redone after a system with the characteristics according to the invention has been put into service, if it is shown that the adjustment has become wrong or if the system has changed. This adjustment can possibly be performed automatically by servo regulating (following an algorithm) of e.g. the register 8 or the phase adjustment circuit 6 with a phase comparison between the incoming transfer signal and the inner clock signal of the system. Sensing for this servo regulating can for example take place in the phase delaying circuits shown. The adjustment can also be performed externally after a warning signal of a malfunction has been given to a malfunction circuit (not shown) from any of the blocks in the system. The function of sensing that there is a malfunction in the system can be performed with the above described phase comparison between the incoming signal and the internal clock signal and a warning issued instead of the above described servo regulation. It is also possible to equip the whole system with an error correction circuit (not shown), which comes into action upon receipt of a warning from any of the constituent part systems (blocks A–D).

I claim:

1. A method for increasing a working speed in a synchronous digital system comprising a plurality of separate system parts and for permitting communication between at least two of the system parts, the method comprising:

distributing a common reference signal having a reference frequency to all system parts;

phase locking to the reference signal an internal signal clock oscillator of each system part; and communicating data between the at least two system parts by relating the reference signal with the internal clock signal of each of the two system parts by adjusting a phase position of the internal clock signal of a second of the two system parts dependent upon a time delay of data communicated from the first system part to the second system part so that the phase positions of the internal clock signals correspond.

2. The method according to claim 1, wherein the reference signal has a frequency different from a frequency of the internal clock signal of each system parts.

3. The method according to claim 1, further comprising:
permanently adjusting a phase position of the internal clock oscillator of each system part after building the system from the system parts and configuring the system parts including the distribution, phase locking, and data communication.

4. The method according to claim 1, wherein the phase position of the internal clock signal of each system part is adaptively adjusted during operation of the system.

5. The method according to claim 1, further comprising:
writing the individual phase adjustment positions of each system part in a register of the system.

6. The method according to claim 1, further comprising;
dividing a frequency of the clock signal oscillator by a value representing a ratio between the frequency of the clock signal oscillator and the frequency of the reference signal.

7. The method according to claim 1, further comprising;
storing signals incoming to a system part in a buffer memory connected to the system part; and
reading out the stored signal with and in phase with the internal clock signal of the system part.

8. The method according to claim 7, wherein signals are only stored in system parts having a different internal clock frequency than a system part with which it communicates.

9. The method according to claim 1, further comprising;
storing outgoing signals of a system part in a buffer memory connected to the system part; and
reading out the stored signal in step with a clock signal adapted for communication with another of the system parts.

10. The method according to claim 9, wherein signals are only stored in system parts having a different internal clock frequency than a system part with which it communicates.

11. A device for increasing a working speed of a synchronous digital system, comprising:
a plurality of separate system parts, wherein data is communicated between at least two of the system parts;
a common reference frequency source interconnected with all of the system parts for generating a reference signal and transmitting the reference signal to the system parts;
a clock signal oscillator for each system part interconnected with the reference frequency source for generating an internal clock signal for each system part;
a clock signal circuit for each system part interconnected with the reference frequency source for locking a phase of the clock signal oscillator to the reference signal; and
a circuit for communicating data between at least two of the system parts by relating the reference signal with the internal clock signal of each of the two system parts by adjusting a phase position of the internal clock signal of a second of the two system parts dependent upon a time delay of data communicated from the first system part to the second system part so that the phase positions of the internal clock signals correspond.

12. The device according to claim 11, where in the internal clock signal of each system part and the reference signal have different frequencies.

13. The device according to claim 11, wherein the clock signal circuit comprises a register in which individual phase adjustment positions of each system part are writable.

14. The device according to claim 11, wherein at least one of the system parts includes at least one adjustable delay circuit.

15. The device according to claim 11, wherein in each system part that communicates with another system part the clock signal circuit comprises:
a controllable phase comparator connected with the reference frequency source for receiving the reference signal,
a division circuit for dividing a frequency of the clock signal oscillator by a value representing a ratio between the frequency of the clock signal oscillator and the frequency of the reference signal, and
phase adjustable circuit,
wherein the division circuit and the phase adjustment circuit are connected between the clock signal oscillator and the comparator to phase adjust the clock signal oscillator.

16. The device according to claim 15, wherein the phase adjustment circuit comprises an adjustable register in a phase controlled circuit.

17. The device according to claim 15, wherein a filter is connected between the phase comparator and the clock signal oscillator.

18. The device according to claim 11, wherein each system part communicates with at least one other system part, each clock signal circuit comprises:
a controllable phase comparator connected to the reference frequency source,
a division circuit that divides a frequency of the internal clock signal oscillator by a value representing a ratio between the frequency of the clock signal oscillator and the frequency of the reference signal, and
an adjustable phase adjustment circuit,
wherein the division circuit is connected between the internal clock signal oscillator and the phase comparator to phase adjust the clock signal oscillator, and the phase adjustment circuit is connected to the phase comparator.

19. The device according to claim 18, wherein the phase adjustment circuit comprises an adjustable register in a phase controlled circuit.

20. The device according to claim 18, wherein a filter is connected between the phase comparator and the clock signal oscillator.

21. The device according to claim 11, further comprising:
at least one buffer memory connected to one of the system parts to store incoming signals and read out the stored signals with and in phase with the internal clock signal of the system part.

22. The device according to claim 21, wherein the buffer memory are only connected in system parts having a different internal clock frequency than a system part with which they communicate.

23. The device according to claim 21, further comprising:
at least one buffer memory connected to one of the system parts for storing outgoing signals and reading out the stored signals in step with a clock signal adapted for communication with another of the system parts.

24. The device according to claim 23, wherein the buffer memory are only connected in system parts having a different internal clock frequency than a system part with which they communicate.

\* \* \* \* \*